United States Patent
Jin et al.

(10) Patent No.: US 11,164,931 B2
(45) Date of Patent: Nov. 2, 2021

(54) ELECTROSTATIC DISCHARGE UNIT IN NON-DISPLAY AREA OF DISPLAY PANEL AND DISPLAY DEVICE HAVING THE DISPLAY PANNEL

(71) Applicant: Shanghai Tianma AM-OLED Co., Ltd., Shanghai (CN)

(72) Inventors: Jian Jin, Shanghai (CN); Congyi Su, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 16 days.

(21) Appl. No.: 16/452,757

(22) Filed: Jun. 26, 2019

(65) Prior Publication Data
US 2020/0303485 A1    Sep. 24, 2020

(30) Foreign Application Priority Data
Mar. 18, 2019    (CN) .......................... 201910203992.0

(51) Int. Cl.
*H01L 51/00*    (2006.01)
*H01L 35/24*    (2006.01)
(Continued)

(52) U.S. Cl.
CPC ...... *H01L 27/3276* (2013.01); *H01L 51/5253* (2013.01); *H02H 9/046* (2013.01)

(58) Field of Classification Search
CPC . H01L 23/60; H01L 27/3276; H01L 51/5253; H01L 27/1214; H01L 27/0296;
(Continued)

(56) References Cited

U.S. PATENT DOCUMENTS

2014/0176838 A1* 6/2014 Hong ................ G02F 1/134363
                                                            349/33
2019/0165312 A1* 5/2019 Bae ..................... H01L 27/3258
(Continued)

FOREIGN PATENT DOCUMENTS

| CN | 104113053 A | 10/2014 |
| CN | 107393906 A | 11/2017 |
| CN | 107845645 A | 3/2018 |

OTHER PUBLICATIONS

CN OA dated Nov. 30, 2020 for corresponding CN Application No. 201910203992.0 and English translation thereof.

*Primary Examiner* — Ismail A Muse
(74) *Attorney, Agent, or Firm* — Tarolli, Sundheim, Covell & Tummino LLP (57) ABSTRACT

The present disclosure provides a display panel and a display device. The display panel has a display area and a non-display area surrounding the display area. The display panel includes: at least one barrier portion located in the non-display area, the at least one barrier portion including a first barrier portion and a second barrier portion, and the second barrier portion being located at a side of the first barrier portion that is away from the display area; a first signal line for applying a first signal; and at least one electrostatic discharge unit arranged between the first barrier portion and the second barrier portion. The at least one electrostatic discharge unit includes a first electrostatic discharge unit. The first electrostatic discharge unit is connected to the first signal line and configured to discharge static electricity on the first signal line.

18 Claims, 8 Drawing Sheets

(51) Int. Cl.
*H01L 29/08* (2006.01)
*H01L 27/32* (2006.01)
*H02H 9/04* (2006.01)
*H01L 51/52* (2006.01)

(58) Field of Classification Search
CPC ......... H01L 2251/5392; H01L 27/3288; H01L 51/5246; H02H 9/046
See application file for complete search history.

(56) References Cited

U.S. PATENT DOCUMENTS

| | | | |
|---|---|---|---|
| 2019/0267569 A1* | 8/2019 | Kim | B29D 11/00644 |
| 2020/0035773 A1* | 1/2020 | Cheng | H01L 27/0296 |
| 2020/0135833 A1* | 4/2020 | Ma | G09G 3/20 |
| 2020/0168689 A1* | 5/2020 | Park | G06F 3/0412 |
| 2020/0273930 A1* | 8/2020 | Zhou | H01L 27/3258 |
| 2020/0321292 A1* | 10/2020 | Park | H01L 27/124 |

* cited by examiner

FIG. 10

ELECTROSTATIC DISCHARGE UNIT IN NON-DISPLAY AREA OF DISPLAY PANEL AND DISPLAY DEVICE HAVING THE DISPLAY PANNEL

CROSS-REFERENCE TO RELATED APPLICATIONS

The present disclosure claims priority to Chinese Patent Application No. 201910203992.0, filed on Mar. 18, 2019, the content of which is incorporated herein by reference in its entirety.

TECHNICAL FIELD

The present disclosure relates to the technical field of display technologies, and in particular, to a display panel and a display device including the same.

BACKGROUND

With the development of display technologies, consumers' requirements on display panels constantly increase, and thus various display panels appear with rapid development, such as liquid crystal display panels, organic light-emitting display panels, etc. Based on this, display technologies such as 3D display, touch display, curved-surface display, ultra-high resolution display and anti-peep display continuously appear so as to meet consumers' requirements.

Organic light-emitting display panels have become the mainstream products in the current display industry due to their advantages such as light weight, high contrast ratio, low energy consumption, and ease of achieving flexibility. They are widely favored by consumers, especially the flexible organic light-emitting display panels. The organic light-emitting display panel includes lead wires for providing various signals to display units, and the lead wires are easily interfered by static electricity. When static electricity has a high strength, components in the display panel may be damaged, thus causing the display panel to be damaged. Therefore, an electrostatic discharge circuit is required for protecting the lead wires. However, the electrostatic discharge circuit needs to occupy a certain border space. Therefore, a technical problem to be solved in the related art is how to arrange the electrostatic discharge circuit so that it can on one hand prevent static electricity from damaging the lead wires and on the other hand prevent the electrostatic discharge circuit from the occupying additional border space.

SUMMARY

In view of this, the present disclosure provides a display panel and a display device, which can on the one hand prevent static electricity from damaging the lead wires and on the other hand prevent the electrostatic discharge circuit from the occupying additional border space by properly setting a position and structure of an electrostatic discharge circuit.

In an aspect, the present disclosure provides a display penal. The display panel has a display area and a non-display area surrounding the display area. The display panel includes: at least one barrier portion located in the non-display area, the at least one barrier portion including a first barrier portion and a second barrier portion, and the second barrier portion being located at a side of the first barrier portion that is away from the display area; a first signal line for applying a first signal; and at least one electrostatic discharge unit arranged between the first barrier portion and the second barrier portion. The at least one electrostatic discharge unit includes a first electrostatic discharge unit. The first electrostatic discharge unit is connected to the first signal line and configured to discharge static electricity on the first signal line.

In another aspect, the present disclosure provides a display device, including the display penal described above.

DESCRIPTION OF EMBODIMENTS

In order to make the purposes, features and advantages of the present disclosure more understandable, the present disclosure will be further described with reference to the accompanying drawings and embodiments.

It should be noted that details are set forth in the following description to better illustrate the present disclosure, however, the present disclosure may also be implemented in various ways other than those described herein, and those skilled in the art can make similar promotion without departing from the scope of the present disclosure. Therefore, the present disclosure is not limited by the embodiments disclosed in the following description.

Figure 1:
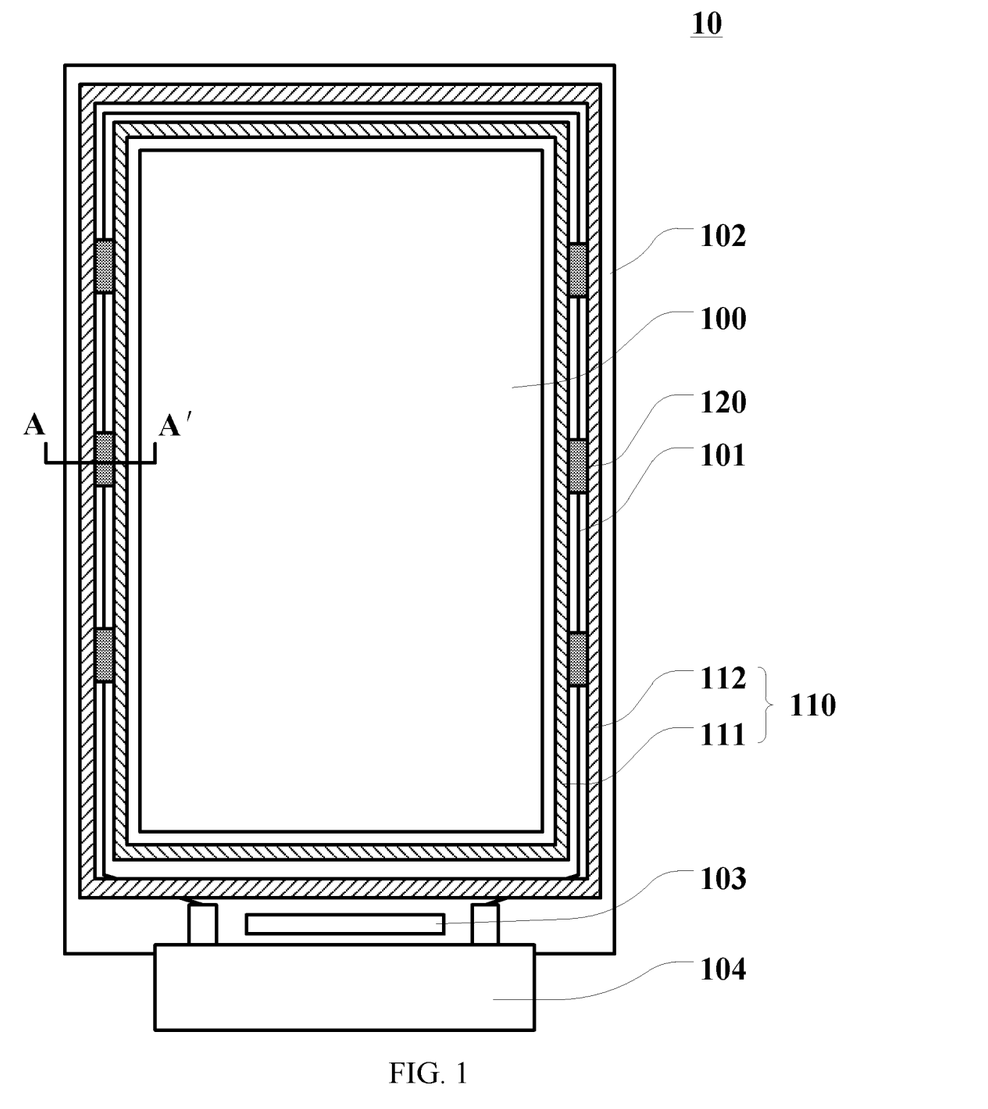
FIG. 1 is a schematic structural diagram illustrating a display panel according to an embodiment of the present disclosure.

FIG. 1 is a schematic structural diagram illustrating a display panel according to an embodiment of the present disclosure. As shown in FIG. 1, the display panel 10 has a display area 100 and a non-display area 102 surrounding the display area 100. The display panel includes: at least one barrier portion 110 located in the non-display area 102, the at least one barrier portion 110 including a first barrier portion 111 and a second barrier portion 112, and the second barrier portion 112 being located at a side of the first barrier portion 111 that is away from the display area 100; a first signal line 101 for applying a first signal; and at least one electrostatic discharge unit 120 arranged between the first barrier portion 111 and the second barrier portion 112, the at least one electrostatic discharge unit 120 including a first electrostatic discharge unit, and the first electrostatic discharge unit being connected to the first signal line 101 for discharging static electricity on the first signal line 101.

It should be noted that the display panel 10 provided in this embodiment of the present disclosure may be an organic light-emitting display panel. The organic light-emitting display panel includes an anode and a cathode, and an organic light-emitting layer arranged between the anode and the cathode. A voltage is applied between the anode and the cathode to excite migration of carriers to act on the organic light-emitting layer to emit light. In other embodiments of the present disclosure, the display panel 10 may alternatively be any other display panel, such as a quantum dot light-emitting display panel, a nano wafer light-emitting display panel, etc., which will not be further described in this embodiment.

In addition, it should be noted that the at least one barrier portion 110 in this embodiment is located in the non-display area 102 for stopping an encapsulation structure of the display panel, which will be described later in this description. The at least one barrier portion 110 is formed by sequentially stacking a flat layer, a pixel definition layer, and a support pillar in the panel, or may be formed by stacking merely a pixel definition layer and a support pillar, which will not be described in detail in this embodiment. Moreover, in addition to the abovementioned structure, FIG. 1 further illustrates a driving chip 103 and a flexible circuit board 104. The first signal line 101 may be connected to the flexible circuit board 104 and be provided with a first signal by the flexible circuit board 104.

As can be seen from the above description, the display panel provided by this embodiment includes the first barrier portion 111 and the second barrier portion 112, and the electrostatic discharge unit 120 is arranged between the first barrier portion 111 and the second barrier portion 112. The electrostatic discharge unit 120 is connected to the first signal line 101 for discharging static electricity on the first signal line 101. With the abovementioned structure, the electrostatic discharge unit is provided in an existing space of the panel, so that no additional border space is occupied, which is advantageous for narrowing the border; meanwhile, the first signal line is protected from being interfered by static electricity, thereby preventing static electricity from affecting performances of the display panel.

Figure 2:
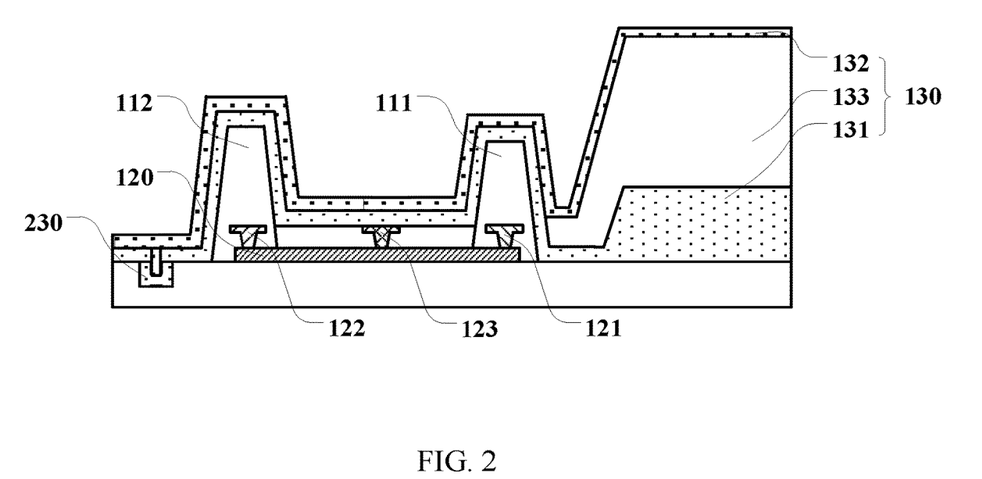
FIG. 2 is a cross-sectional view along a direction A-A' of FIG. 1.

FIG. 2 is a cross-sectional view along a direction A-A' of FIG. 1. As shown in FIG. 2, the display panel 10 includes a thin film encapsulation layer 130 including a first inorganic layer 131, a second inorganic layer 132, and an organic layer 133 arranged between the first inorganic layer 131 and the second inorganic layer 132. The organic layer 133 extends from the display area 100 to the non-display area 102 and stops at the first barrier portion 111. In this embodiment, the first inorganic layer 131 and the second inorganic layer 132 are mainly provided to prevent moisture and oxygen from entering an interior of the display panel, and the organic layer 133 is provided to relieve stress and achieve planarization of a surface of the encapsulation layer. The organic layer 133 extends towards and stops at the first barrier portion 111, whereas the first inorganic layer 131 and the second inorganic layer 132 extend beyond the first barrier portion 111 and then further extend to cover the electrostatic discharge unit 120 and then further extend beyond the second barrier portion 112. Each of the first inorganic layer 131 and the second inorganic layer 132 has a coverage area that is larger than a coverage area of the organic layer 133, thereby better blocking out moisture and oxygen.

In an embodiment, the first inorganic layer 131 and the second inorganic layer 132 completely cover the electrostatic discharge unit 120 in a direction perpendicular to the surface of the display panel 10. The electrostatic discharge unit 120 is generally a circuit structure formed by a metal layer and other conductive layers, and the metal layer can be easily eroded by moisture and oxygen. Therefore, the inorganic encapsulation layers completely cover the electrostatic discharge unit 120, so that the electrostatic discharge unit can be further prevented from being affected by moisture and oxygen, as a result of the barrier function of the two inorganic layers.

In an embodiment, as shown in FIG. 2, optionally, in a direction perpendicular to the surface of the display panel, the second barrier portion 112 has a projection area that is larger than a projection area of the first barrier portion 111, and/or the second barrier portion 112 has a height that is larger than a height of the first barrier portion 111. The second barrier portion 112 is located at the side of the first barrier portion 111 that is away from the display area. Therefore, the second barrier portion is designed to be larger in volume so that a better barrier can be formed to stop the thin film encapsulation layer, and then the display panel can be protected from being affected by moisture and oxygen. In another embodiment, the first barrier portion 111 may have a size that is the same as a size of the second barrier portion 112, or the first barrier portion 111 may have a size that is larger than the size of the second barrier portion 112, depending on an actual situation, which will not be further described herein in the embodiments of the present disclosure.

In an embodiment, as shown in FIG. 2, since the electrostatic discharge unit 120 is arranged between the two barrier portions, in order to prevent the electrostatic discharge unit 120 from being affected by moisture and oxygen, the display panel 10 is provided with a groove 230 at a side of the second barrier portion 112 that is away from the display area 100, and the first inorganic layer 131 and the second inorganic layer 132 cover the groove 230. The groove 230 can increase a path for moisture and oxygen to enter, thereby further preventing the electrostatic discharge unit 120 and structures inside the display panel from being affected by moisture and oxygen. The groove 230 may be provided in a substrate of the display panel 10, or may also be provided in a film layer below the inorganic layer. The groove 230 may be a single groove or a structure formed by connecting a plurality of grooves, and the design depends on the actual situation and the embodiments of the present disclosure are not limited thereto.

As shown in FIG. 2, the electrostatic discharge unit 120 includes a first potential connection terminal 121, a second potential connection terminal 122, and an external signal connection terminal 123. The first potential connection terminal 121 is configured to be connected to a first potential. The second potential connection terminal 122 is configured to be connected to the second potential. Here, one of the first potential and the second potential is a high potential, and the other one of the first potential and the second potential is a low potential. The external signal connection terminal 123 of the first electrostatic discharge unit is configured to be connected to the first signal line 101. A driving circuit of a general display panel includes a high potential input terminal for receiving a high-level signal and a low potential input terminal for receiving a low-level signal. In this embodiment, the electrostatic discharge unit 120 includes the first potential connection terminal 121 and the second potential connection terminal 122, so as to discharge the potential on the first signal line 101 that is higher than the high-level signal through the high potential connection terminal and discharge the potential on the first signal line 101 that is lower than the low-level signal through the low potential connection terminal.

Further, in an embodiment, the display panel 10 includes a first metal layer and a second metal layer. The display panel includes a gate signal line arranged in the first metal layer and a data signal line arranged in the second metal layer. The connection terminal 121 and the second potential connection terminal 122 are arranged in the second metal layer. The display panel generally includes a gate signal line for providing a gate scan signal to a transistor in a pixel circuit, and a data signal line for writing a data signal to the pixel circuit. Moreover, the display panel further includes a high-level signal line and a low-level signal line for respectively providing a high-level signal and a low-level signal to the driving circuit in the display panel. The high-level signal line and the low-level signal line are generally arranged in the second metal layer. In this embodiment, the first potential connection terminal 121 and the second potential connection terminal 122 are arranged in the second metal layer, so that the process can be simplified.

Figure 3:
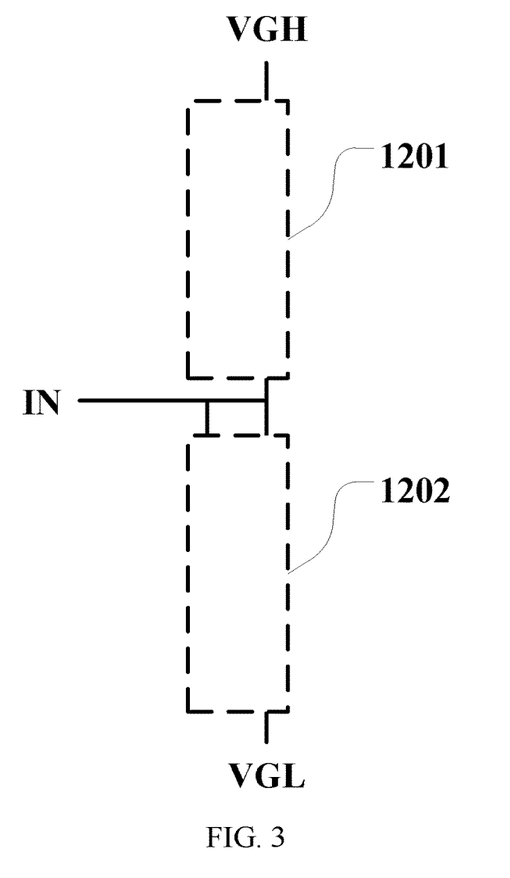
FIG. 3 is a schematic diagram illustrating a connection relationship of an electrostatic discharge unit according to an embodiment of the present disclosure.

FIG. 3 is a schematic diagram illustrating a connection relationship of an electrostatic discharge unit according to an embodiment of the present disclosure. In an embodiment, as shown in FIG. 3, optionally, the electrostatic discharge unit 120 includes a first set of transistors 1201 and a second set of transistors 1202. The first set of transistors 1201 is configured to connect the first potential connection terminal 121 with the external signal connection terminal 123, and the second set of transistors 1202 is configured to connect the second potential connection terminal 122 with the external signal connection terminal 123. Each of the first set of transistors 1201 and the second set of transistors 1202 includes at least one transistor. Further, the first potential is a high potential, and the second potential is a low potential. The first transistor in the first set of transistors 1201 has source and gate electrodes connected to the first potential connection terminal 121, and the last transistor in the first set of transistors 1201 has a drain electrode connected to the external signal connection terminal 123. The drain electrode of each of the remaining transistors in the first set of transistors 1201 is connected to the source and gate electrodes of the next transistor in the first set of transistors 1201. The first transistor in the second set of transistors 1202 has a source electrode connected to the second potential connection terminal 122, and the last transistor in the second set of transistors 1202 has gate and drain electrodes connected to the external signal connection terminal 123. The gate and drain electrodes of each of the remaining transistors in the second set of transistors 1202 are connected to the source electrode of the next transistor in the second set of transistors 1202.

It should be noted that, for better illustration, as shown in FIG. 3, a high potential signal connection terminal is indicated as VGH, a low potential signal connection terminal is indicated as VGL, and the external signal connection terminal is indicated as IN. With the circuit structure described above, when a signal on the signal line connected to the external signal connection terminal is at a normal potential, i.e., a potential lower than the high potential and higher than the low potential, the signal line is in normal operation. When static electricity on the signal line is higher than the high potential, the transistors in the first set of transistors 1201 are turned on, and static electricity can be discharged from the VGH terminal through the first set of transistors 1201. When static electricity on the signal line is lower than the low potential, the transistors in the second set of transistors 1202 are turned on, and static electricity can be discharged from the VGL terminal through the second set of transistors 1202. In this embodiment, the transistors are PMOS transistors that are turned on when the potentials at their gate electrodes are lower than the potentials at their source electrodes. In other embodiments, the transistors may alternatively be NMOS transistors, in this case, the first set of transistors 1201 is connected to the VGL and the second set of transistors 1202 is connected to the VGH, and a final function thereof is also discharging of static electricity to prevent static electricity from damaging the display panel.

Figure 4:
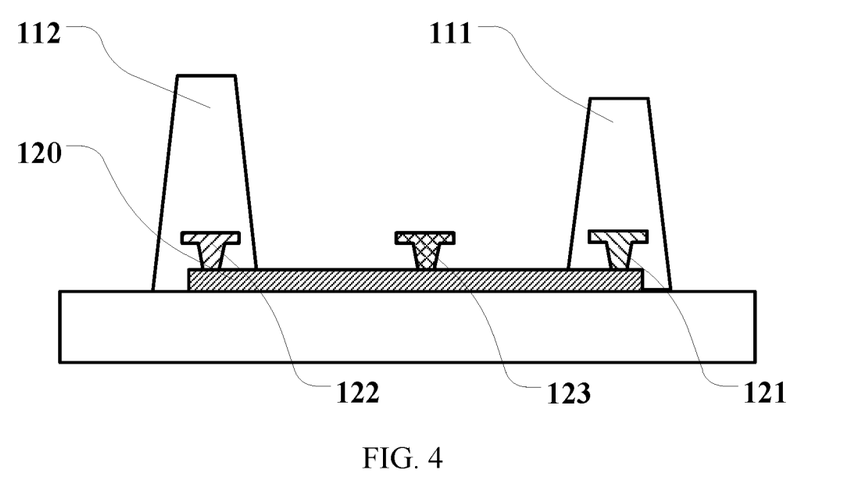
FIG. 4 is a schematic diagram illustrating a position of an electrostatic discharge unit according to an embodiment of the present disclosure.

FIG. 4 is a schematic diagram illustrating a position of an electrostatic discharge unit according to an embodiment of the present disclosure. As shown in FIG. 4, in the direction perpendicular to the surface of the display panel, the first potential connection terminal 121 at least partially overlaps the first barrier portion 111, and the second potential connection terminal 122 at least partially overlaps the second barrier portion 112. The inventor of the present disclosure found that the barrier portion is generally made of an organic material and contacts a film layer below with a generally low contact strength. When a metal layer is arranged between the barrier portion and the film layer below, the contact strength between the barrier portion and the film layer below can be improved, thereby avoiding separation of the barrier portion. Therefore, in this embodiment, the first potential connection terminal 121 is arranged at a position corresponding to the first barrier portion 111, and the second potential connection terminal 122 is arranged at a position corresponding to the second barrier portion 112, so that on one hand an area the electrostatic discharge unit 120 occupies between the two barrier portions can be reduced, and on the other hand the contact strength between the two barrier portions and the film layer below can be improved, thereby improving reliability of the panel.

Figure 5:
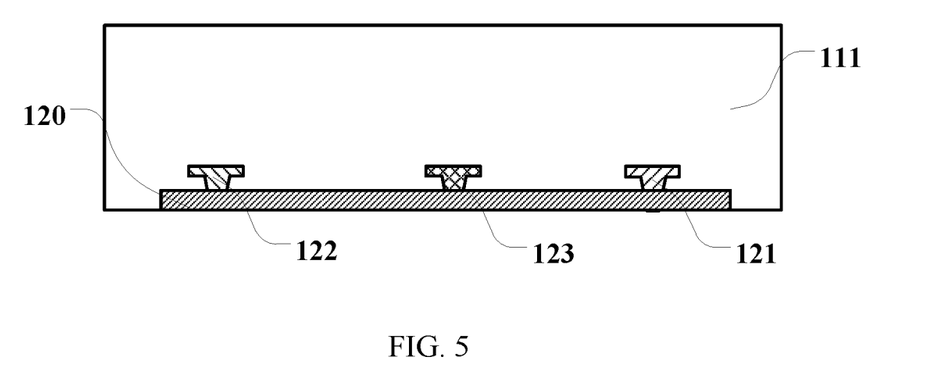
FIG. 5 is a schematic diagram illustrating a position of another electrostatic discharge unit according to an embodiment of the present disclosure.

FIG. 5 is a schematic diagram illustrating a position of another electrostatic discharge unit according to an embodiment of the present disclosure. As shown in FIG. 5, in the direction perpendicular to the surface of the display panel, the first potential connection terminal 121 at least partially overlaps the first barrier portion 111, and the second potential connection terminal 122 at least partially overlap the first barrier portion 111. Since the second barrier portion 112 is located at the side of the first barrier portion 111 that is away from the display area 100, the second barrier portion 112 is easier to be eroded by moisture and oxygen than the first barrier portion 111. Therefore, in order to further protect the electrostatic discharge unit 120 from being eroded by moisture and oxygen, both the first potential connection terminal 121 and the second potential connection terminal 122 are arranged at a position corresponding to the first barrier portion 111.

Further, in this embodiment, in order to better protect the electrostatic discharge unit 120 from moisture and oxygen, when the first potential connection terminal 121 is arranged below the first barrier portion 111 and the second potential connection terminal 122 is arranged below the second barrier portion 112, the first barrier portion 111 completely covers the first potential connection terminal 121 and the second barrier portion 112 completely covers the second potential connection terminal 122 in the direction perpendicular to the surface of the display panel; when both the first potential connection terminal 121 and the second potential connection terminal 122 are arranged below the first barrier portion 111, the first barrier portion 111 completely covers the first potential connection terminal 121 and the second potential connection terminal 122.

Figure 6:
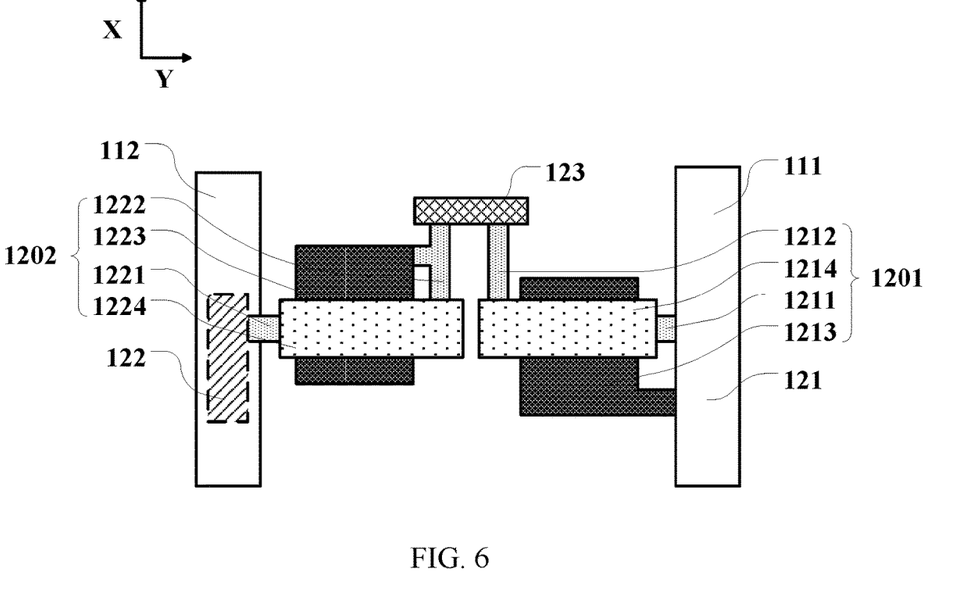
FIG. 6 is a schematic structural diagram illustrating an electrostatic discharge unit according to an embodiment of the present disclosure.

FIG. 6 is a schematic structural diagram illustrating an electrostatic discharge unit according to an embodiment of the present disclosure. As shown in FIG. 6, the first barrier portion 111 extends in a first direction X, the first potential connection terminal 121 and the second potential connection terminal 122 are located on a same line in a second direction Y, and a current direction of the electrostatic discharge unit 120 is the second direction Y. Here, the first direction X is perpendicular to the second direction Y in the plane parallel with the display panel. In this embodiment, the first potential connection terminal 121 is arranged below the first barrier portion 111 and the second potential connection terminal 122 is arranged below the second barrier portion 112, and the first potential connection terminal 121 and the second potential connection terminal 122 are located on a same line in the second direction Y. FIG. 6 only shows a case where the first set of transistors 1201 and the second set of transistors 1202 each include one transistor, and in this case, the source electrode 1211 and the gate electrode 1213 of the first set of transistors 1201 are connected to the first potential connection terminal 121, the drain electrode 1212 of the first set of transistors 1201 is connected to the external signal connection terminal 123, and an area where the active layer 1214 overlaps the gate electrode 1213 forms a channel area; the source electrode 1221 of the second set of transistors 1202 is connected to the second potential connection terminal 122, the drain electrode 1222 and the gate electrode 1223 of the second set of transistors 1202 are connected to the external signal connection terminal 123, and an area where the active layer 1224 overlaps the gate electrode 1223 forms a channel area. Current of a transistor is transmitted between its source electrode and its drain electrode, thus in this embodiment shown in FIG. 6, the current is transmitted in the second direction Y.

Figure 7:
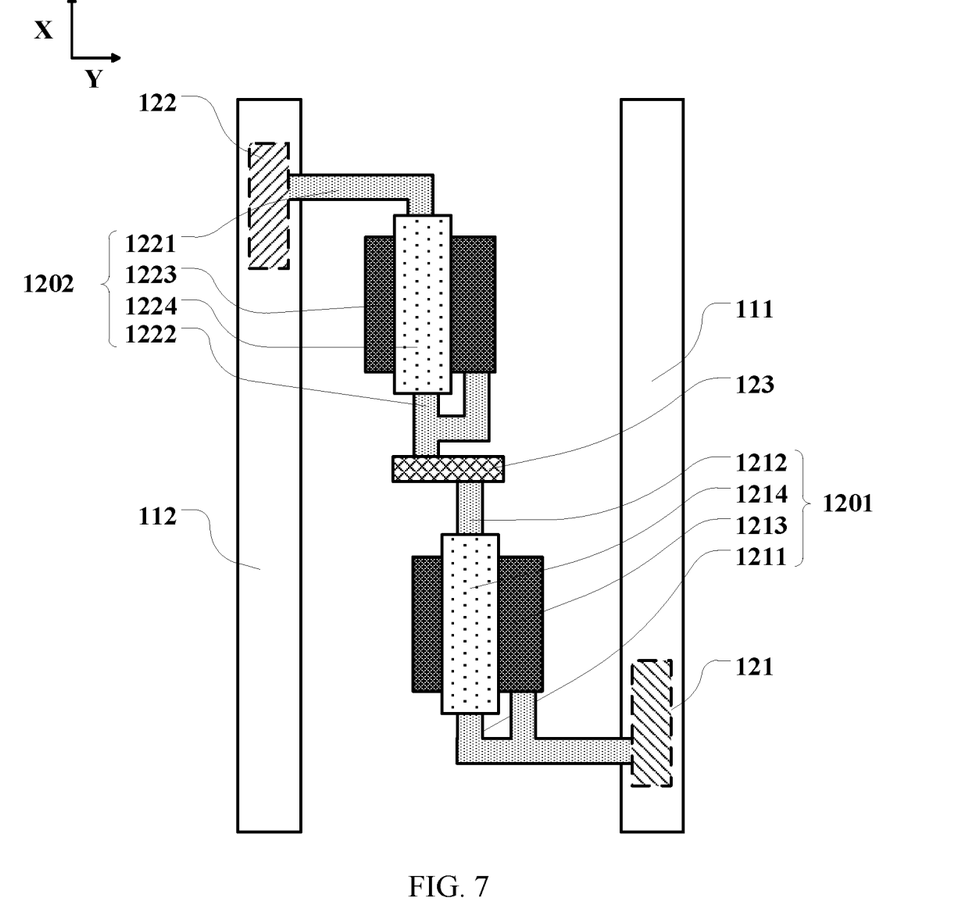
FIG. 7 is a schematic structural diagram illustrating another electrostatic discharge unit according to an embodiment of the present disclosure.

FIG. 7 is a schematic structural diagram illustrating another electrostatic discharge unit according to an embodiment of the present disclosure. As shown in FIG. 7, the first barrier portion 111 extends in the first direction X, the first potential connection terminal 121 and the second potential connection terminal 122 have a preset distance therebetween in the first direction X, and a current direction of the electrostatic discharge unit 120 is the first direction X. In this embodiment, the first potential connection terminal 121 is arranged below the first barrier portion 111, and the second potential connection terminal 122 is arranged below the second barrier portion 112. The first set of transistors 1201 and the second set of transistors 1202 each include one transistor, and in this case, the source electrode 1211 and the gate electrode 1213 of the first set of transistors 1201 are connected to the first potential connection terminal 121, and the drain electrode 1212 of the first set of transistors 1201 is connected to the external signal connection terminal 123, and an area where the active layer 1214 overlaps the gate electrode 1213 forms a channel area; the source electrode 1221 of the second set of transistors 1202 is connected to the second potential connection terminal 122, the drain electrode 1222 and the gate electrode 1223 of the second set of transistors 1202 are connected to the external signal connection terminal 123, and an area where the active layer 1224 overlaps the gate electrode 1223 forms a channel area. Current of a transistor is transmitted between its source electrode and its drain electrode, and in the embodiment shown in FIG. 7, the first potential connection terminal 121, the second potential connection terminal 122, and the external signal connection terminal 123 extend in the first direction X, thus, the current of the transistor is transmitted in the first direction X. In this embodiment, since the transistor extends in the first direction X, a width of the electrostatic discharge unit 120 in the second direction Y can be reduced, so that a border of the display panel can be reduced and narrow border display can be achieved.

Figure 8:
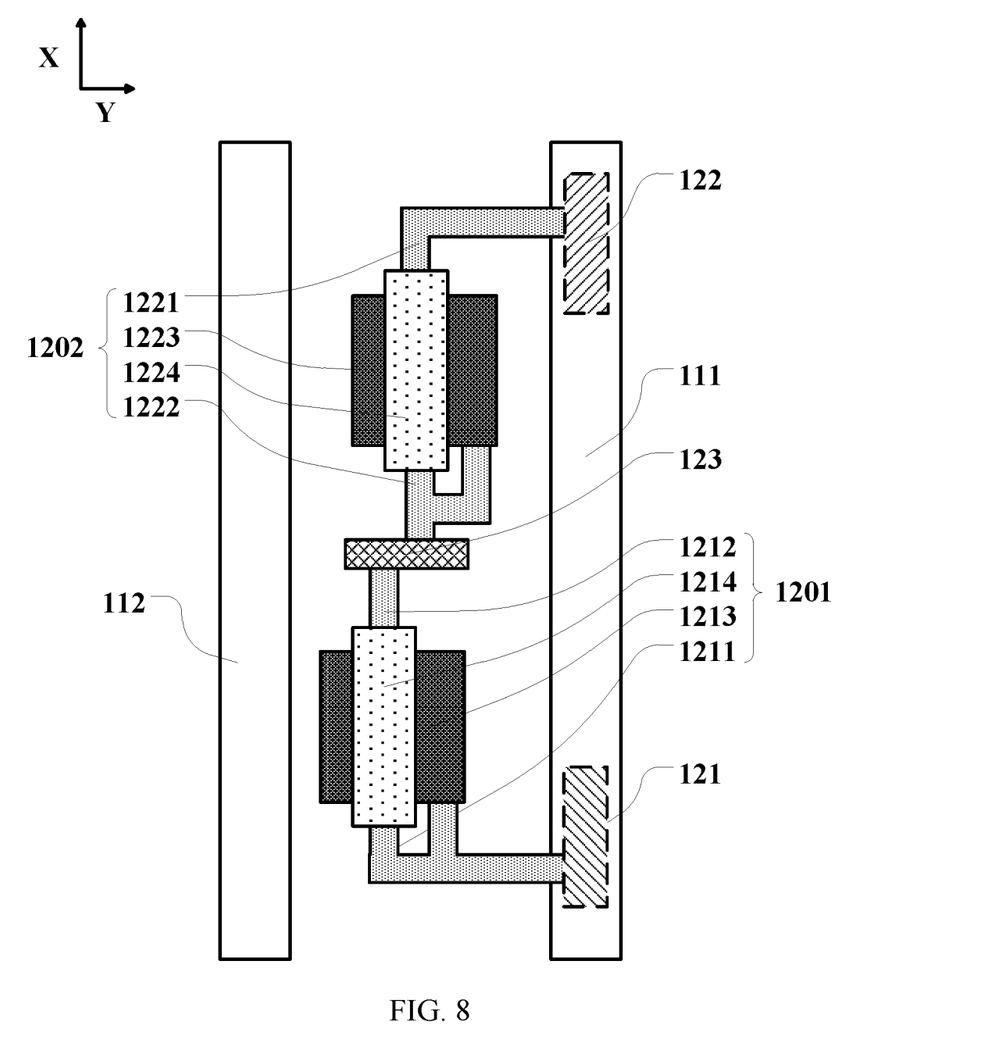
FIG. 8 is a schematic structural diagram illustrating still another electrostatic discharge unit according to an embodiment of the present disclosure.

FIG. 8 is a schematic structural diagram illustrating still another electrostatic discharge unit according to an embodiment of the present disclosure. As shown in FIG. 8, the first potential connection terminal 121 is arranged below the first barrier portion 111, the second potential connection terminal 122 is arranged below the second barrier portion 112, the first barrier portion 111 extends in the first direction X, and the first potential connection terminal 121 and the second potential connection terminal 122 have a preset distance therebetween in the first direction X. The current direction of the electrostatic discharge unit 120 is the first direction X. The first set of transistors 1201 and the second set of transistors 1202 each include one transistor. In this case, the source electrode 1211 and the gate electrode 1213 of the first set of transistors 1201 are connected to the first potential connection terminal 121, the drain electrode 1212 of the first set of transistors 1201 is connected to the external signal connection terminal 123, and an area where the active layer 1214 overlaps the gate electrode 1213 forms a channel area; the source electrode 1221 of the second set of transistors 1202 is connected to the second potential connection terminal 122, the drain electrode 1222 and the gate electrode 1223 of the second set of transistors 1202 are connected to the external signal connection terminal 123, and an area where the active layer 1224 overlaps the gate electrode 1223 form a channel area. In this embodiment, on one hand, since the transistor extends in the first direction X, a width of the electrostatic discharge unit 120 in the second direction Y can be reduced, so that a border of the display panel can be reduced and narrow border display can be achieved; on the other hand, since both the first potential connection terminal 121 and the second potential connection terminal 122 are arranged below the first barrier portion 111, and the second barrier portion 112 is located at the side of the first barrier portion 111 that is away from the display area, a risk of the first potential connection terminal 121 and the second potential connection terminal 122 being eroded by moisture and oxygen can be reduced.

Figure 9:
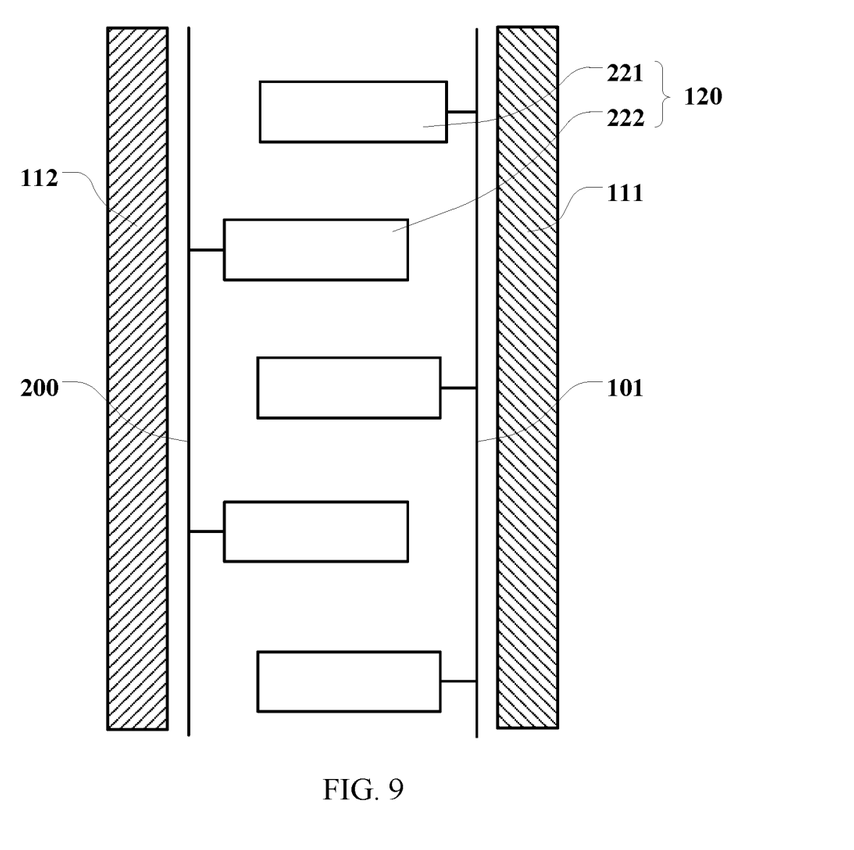
FIG. 9 is a schematic diagram illustrating distribution of an electrostatic discharge unit according to an embodiment of the present disclosure.

FIG. 9 is a schematic diagram illustrating distribution of an electrostatic discharge unit according to an embodiment of the present disclosure. As shown in FIG. 9, the display panel 10 further includes a second signal line 200 for applying a second signal. The at least one electrostatic discharge unit 120 further includes a second electrostatic discharge unit 222 in addition to the first electrostatic discharge unit 221. The second electrostatic discharge unit 222 is connected to the second signal line 200 for discharging static electricity on the second signal line 200. The second electrostatic discharge unit 222 and the first electrostatic discharge unit 221 may have the same structure. Since the barrier portion in the display panel is formed around the display area, there is an area around the display area between the two barrier portions. With the first electrostatic discharge unit 221 and the second electrostatic discharge unit 222 for respectively discharging signals on the first signal line 101 and the second signal line 200, a space between the barrier portions can be sufficiently utilized, thereby improving the reliability of the display panel.

In an embodiment, the first electrostatic discharge unit 221 and the second electrostatic discharge unit 222 are alternately arranged along the first direction X. In other embodiments, the first electrostatic discharge unit 221 may be located in an area, and the second electrostatic discharge unit 222 may be located in another area. The distribution thereof is determined according to an actual situation, which is not limited herein by the embodiments.

Further, in this embodiment, the display panel 10 is an organic light-emitting display panel including an organic light-emitting element. The first signal is a signal received by the cathode of the organic light-emitting element and denoted as a VEE signal, or is a signal received by the anode of the organic light emitting element and denoted as a VDD signal. Moreover, the first signal may be a VEE signal and the second signal may be a VDD signal, thereby discharging static electricity on the VEE signal line and the VDD signal line through the electrostatic discharge unit 120.

In another aspect, an embodiment of the present disclosure provides a display device including the display panel described in any of the above embodiments.

Figure 10:
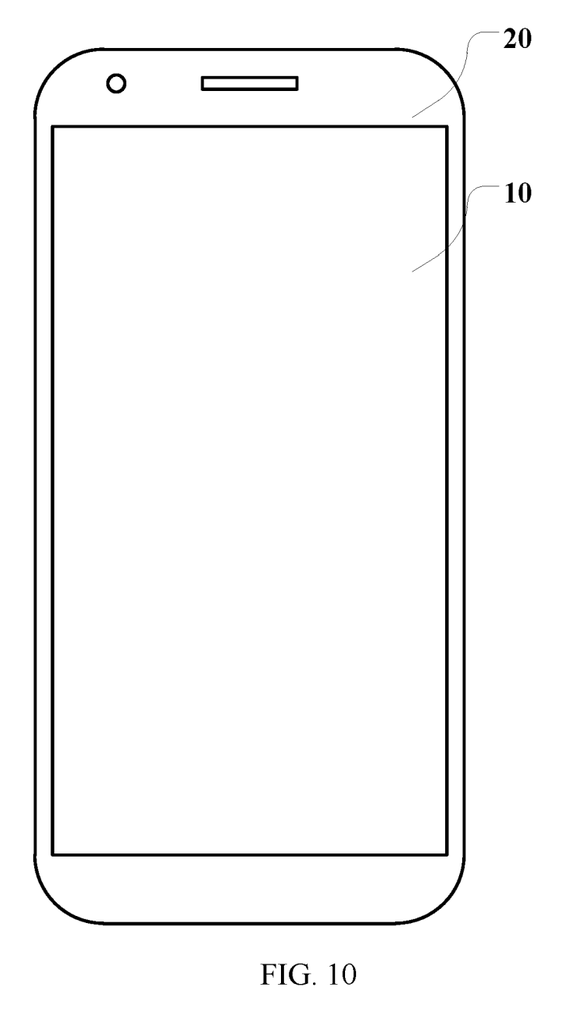
FIG. 10 is a schematic diagram illustrating a display device according to an embodiment of the present disclosure.

FIG. 10 is a schematic diagram illustrating a display device according to an embodiment of the present disclosure. As shown in FIG. 10, the display device 20 includes a display panel 10 described in any of the above embodiments. The display device 20 can be a cellphone, a foldable display screen, a notebook computer, a television, a watch, or a smart wearable display device, etc., which will not be limited herein by the embodiments of the present disclosure.

As can be seen from the above description, the display panel provided by this embodiment includes a first barrier portion 111 and a second barrier portion 112. An electrostatic discharge unit 120 is arranged between the first barrier portion 111 and the second barrier portion 112 and is connected to the first signal line 101 for discharging static electricity on the first signal line 101. With the abovementioned structure, the electrostatic discharge unit can be provided in an existing space of the panel, so that no additional border space is occupied, which is advantageous for narrowing the border. Meanwhile, the first signal line is protected from being interfered by static electricity, thereby preventing static electricity from affecting performances of the display panel. Moreover, by setting the position, structure and distribution of the electrostatic discharge unit 120, the display panel can be prevented from being interfered by static electricity, and a narrow border can be achieved, thereby improving the overall performance of the display panel.

The above description is a further detailed description of the present disclosure in connection with preferred embodiments, and the embodiments of the present disclosure are not limited to the above description. Various deductions or substitutions may be made by those skilled in the art without departing from the general principle the present disclosure, all of which shall fall into the protection scope of the present disclosure.

What is claimed is:

1. A display panel, having a display area and a non-display area surrounding the display area, the display panel comprising:
   at least one barrier portion located in the non-display area, the at least one barrier portion comprising a first barrier portion and a second barrier portion, and the second barrier portion being located at a side of the first barrier portion that is away from the display area;
   a first signal line for applying a first signal; and
   at least one electrostatic discharge unit arranged between the first barrier portion and the second barrier portion, the at least one electrostatic discharge unit comprising a first electrostatic discharge unit, and the first electrostatic discharge unit is connected to the first signal line and is configured to discharge static electricity on the first signal line,
   wherein each of the at least one electrostatic discharge unit comprises a first potential connection terminal, a second potential connection terminal, and an external signal connection terminal, wherein the first potential connection terminal is configured to be connected to a first potential, the second potential connection terminal is configured to be connected to a second potential, one of the first potential and the second potential is a high potential and the other one of the first potential and the second potential is a low potential, the external signal connection terminal of the first electrostatic discharge unit is configured to be connected to the first signal line.

2. The display panel according to claim 1, further comprising a thin film encapsulation layer, wherein the thin film encapsulation layer comprises a first inorganic layer, a second inorganic layer, and an organic layer arranged between the first inorganic layer and the second inorganic layer, the organic layer extending from the display area to the non-display area and stopping at the first barrier portion.

3. The display panel according to claim 2, wherein in a direction perpendicular to a surface of the display panel, the first inorganic layer and the second inorganic layer cover the at least one electrostatic discharge unit.

4. The display panel according to claim 2, wherein in a direction perpendicular to a surface of the display panel, the second barrier portion has a projection area that is larger than a projection area of the first barrier portion.

5. The display panel according to claim 2, wherein in a direction perpendicular to a surface of the display panel, the second barrier portion has a height that is larger than a height of the first barrier portion.

6. The display panel according to claim 2, wherein the display panel is provided with a groove at a side of the second barrier portion that is away from the display area, and the first inorganic layer and the second inorganic layer cover the groove.

7. The display panel according to claim 1, further comprising a first metal layer and a second metal layer, wherein the display panel comprises a gate signal line arranged in the first metal layer and a data signal line arranged in the second metal layer, and
   the first potential connection terminal and the second potential connection terminal are arranged in the second metal layer.

8. The display panel according to claim 1, wherein each of the at least one electrostatic discharge unit comprises a first set of transistors and a second set of transistors, the first set of transistors is configured to connect the first potential connection terminal with the external signal connection terminal, and the second set of transistors is configured to connect the second potential connection terminal with the external signal connection terminal.

9. The display panel according to claim 8, wherein the first potential is the high potential and the second potential is the low potential;
   a first transistor in the first set of transistors has source and gate electrodes connected to the first potential connection terminal, a last transistor in the first set of transistors has a drain electrode connected to the external signal connection terminal, and a drain electrode of each of remaining transistors in the first set of transistors is connected to source and gate electrodes of a next transistor in the first set of transistors;

a first transistor in the second set of transistors has a source electrode connected to the second potential connection terminal, a last transistor in the second set of transistors has gate and drain electrodes connected to the external signal connection terminal, and gate and drain electrodes of each of remaining transistors in the second set of transistors are connected to a source electrode of a next transistor in the second set of transistors.

10. The display panel according to claim 1, wherein in a direction perpendicular to a surface of the display panel, the first potential connection terminal at least partially overlaps the first barrier portion, and the second potential connection terminal at least partially overlaps the second barrier portion.

11. The display panel according to claim 10, wherein the first barrier portion extends in a first direction, the first potential connection terminal and the second potential connection terminal are arranged on a same line in a second direction, and a current direction of the at least one electrostatic discharge unit is the second direction, wherein the first direction is perpendicular to the second direction in a plane parallel with the display panel.

12. The display panel according to claim 10, wherein the first barrier portion extends in a first direction, the first potential connection terminal and the second potential connection terminal have a preset distance therebetween in the first direction, and a current direction of the at least one electrostatic discharge unit is the first direction.

13. The display panel according to claim 6, wherein in a direction perpendicular to a surface of the display panel, the first potential connection terminal at least partially overlaps the first barrier portion, and the second potential connection terminal at least partially overlaps the first barrier portion.

14. The display panel according to claim 13, wherein the first barrier portion extends in a first direction, the first potential connection terminal and the second potential connection terminal have a preset distance therebetween in the first direction, and a current direction of the at least one electrostatic discharge unit is the first direction.

15. The display panel according to claim 1, further comprising a second signal line for applying a second signal, wherein the at least one electrostatic discharge unit further comprises a second electrostatic discharge unit connected to the second signal line for discharging static electricity on the second signal line.

16. The display panel according to claim 15, wherein the first barrier portion extends in a first direction, and the first electrostatic discharge unit and the second electrostatic discharge unit are alternately arranged in the first direction.

17. The display panel according to claim 1, wherein the display panel is an organic light-emitting display panel comprising an organic light-emitting element, the first signal is a signal received by a cathode of the light-emitting element or a signal received by an anode of the organic light-emitting element.

18. A display device, comprising a display panel having a display area and a non-display area surrounding the display area, the display panel comprising:

at least one barrier portion located in the non-display area, the at least one barrier portion comprising a first barrier portion and a second barrier portion, and the second barrier portion being located at a side of the first barrier portion that is away from the display area;

a first signal line for applying a first signal; and at least one electrostatic discharge unit arranged between the first barrier portion and the second barrier portion, the at least one electrostatic discharge unit comprising a first electrostatic discharge unit, and the first electrostatic discharge unit being connected to the first signal line and configured to discharge static electricity on the first signal line, wherein each of the at least one electrostatic discharge unit comprises a first potential connection terminal, a second potential connection terminal, and an external signal connection terminal, wherein the first potential connection terminal is configured to be connected to a first potential, the second potential connection terminal is configured to be connected to a second potential, one of the first potential and the second potential is a high potential and the other one of the first potential and the second potential is a low potential, the external signal connection terminal of the first electrostatic discharge unit is configured to be connected to the first signal line.

* * * * *